United States Patent [19]
Araki et al.

[11] Patent Number: 5,400,039
[45] Date of Patent: Mar. 21, 1995

[54] INTEGRATED MULTILAYERED MICROWAVE CIRCUIT

[75] Inventors: Hiroshi Araki, Katsuta; Akira Endo, Mito, both of Japan

[73] Assignees: Hitachi, Ltd., Tokyo; Hitachi Automotive Engineering Co., Ltd., Ibaraki, both of Japan

[21] Appl. No.: 992,108

[22] Filed: Dec. 17, 1992

[30] Foreign Application Priority Data

Dec. 27, 1991 [JP] Japan .................................. 3-347189

[51] Int. Cl.⁶ .................................................. H01Q 1/38
[52] U.S. Cl. ......................... 343/760 MS; 343/846; 455/297
[58] Field of Search ........... 343/700 MS, 846; 342/422, 359, 355; 257/700, 774; 29/830; 174/266; 455/269, 276, 297, 312, 293; H01Q 1/38

[56] References Cited

U.S. PATENT DOCUMENTS

| | | | |
|---|---|---|---|
| 4,560,962 | 12/1985 | Barrow | 333/1 |
| 4,683,653 | 8/1987 | Iwasa | 29/830 |
| 4,821,042 | 4/1989 | Ohe et al. | 343/713 |
| 5,010,641 | 4/1991 | Sisler | 29/830 |
| 5,068,669 | 11/1991 | Koert et al. | 343/700 MS |
| 5,166,693 | 11/1992 | Nishikawa et al. | 343/700 MS |

FOREIGN PATENT DOCUMENTS

| | | |
|---|---|---|
| 2853205 | 6/1979 | Germany . |
| 3838486 | 5/1990 | Germany . |
| 3843787 | 7/1990 | Germany . |
| 3914525 | 11/1990 | Germany . |
| 63-316905 | 12/1988 | Japan . |
| 1-112827 | 5/1989 | Japan . |
| 2-44902 | 2/1990 | Japan . |
| 2-152304 | 6/1990 | Japan . |

*Primary Examiner*—Donald Hajec
*Assistant Examiner*—Hoanganh Le
*Attorney, Agent, or Firm*—Evenson, McKeown, Edwards & Lenahan

[57] ABSTRACT

An integrated multi-layered microwave circuit includes a substrate which is constituted by dielectric layers and conductive layers laminated alternately. The conductive layer disposed at one major surface of the substrate forms a micro strip line which constitutes an antenna portion. The conductive layer disposed at the other major surface of the substrate forms a circuit pattern including a grounding line and a power source line, and then the circuit pattern forms a communication portion together with discrete parts incorporated in the circuit pattern. One of the intermediate conductive layers of the substrate constitutes a grounding layer and the other thereof constitutes a power source layer. In the substrate, a feeding via hole, a via hole for a power source, and a grounding via hole are formed so as to penetrate the substrate. Conductors are formed on the inner walls of the substrate forming the feeding via hole, the via hole for the power source, and the grounding via hole by the plating technique, respectively, whereby the antenna portion, the power source layer and the grounding layer are electrically connected to the communication portion, the power source line and the grounding line, respectively. The antenna portion is provided with a feeding land connected to the conductors of the feeding via hole, three radiators each having a circular configuration formed by the micro strip line, and a phase shifter formed by the micro strip line for connecting the respective radiators to the feeding land.

17 Claims, 15 Drawing Sheets

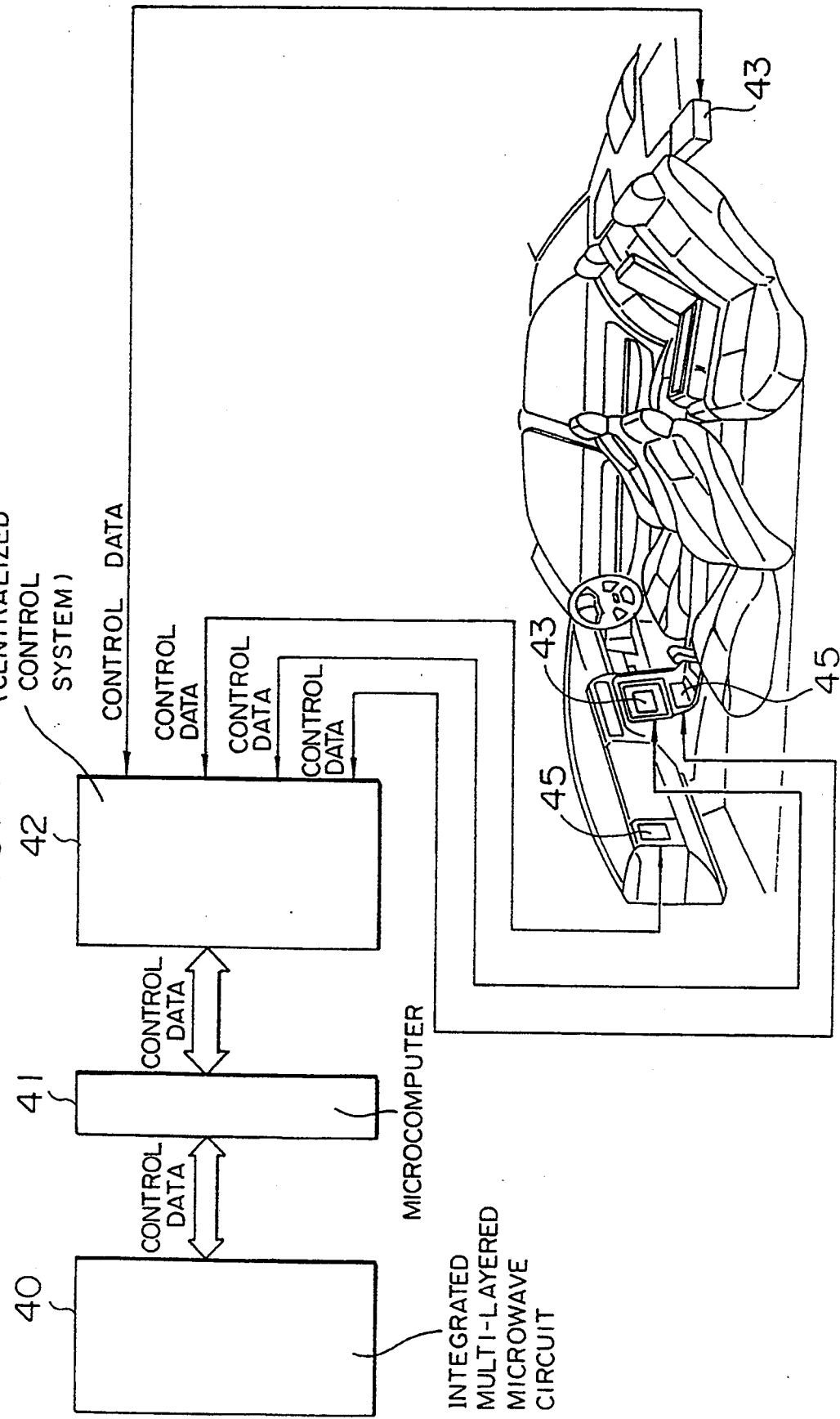

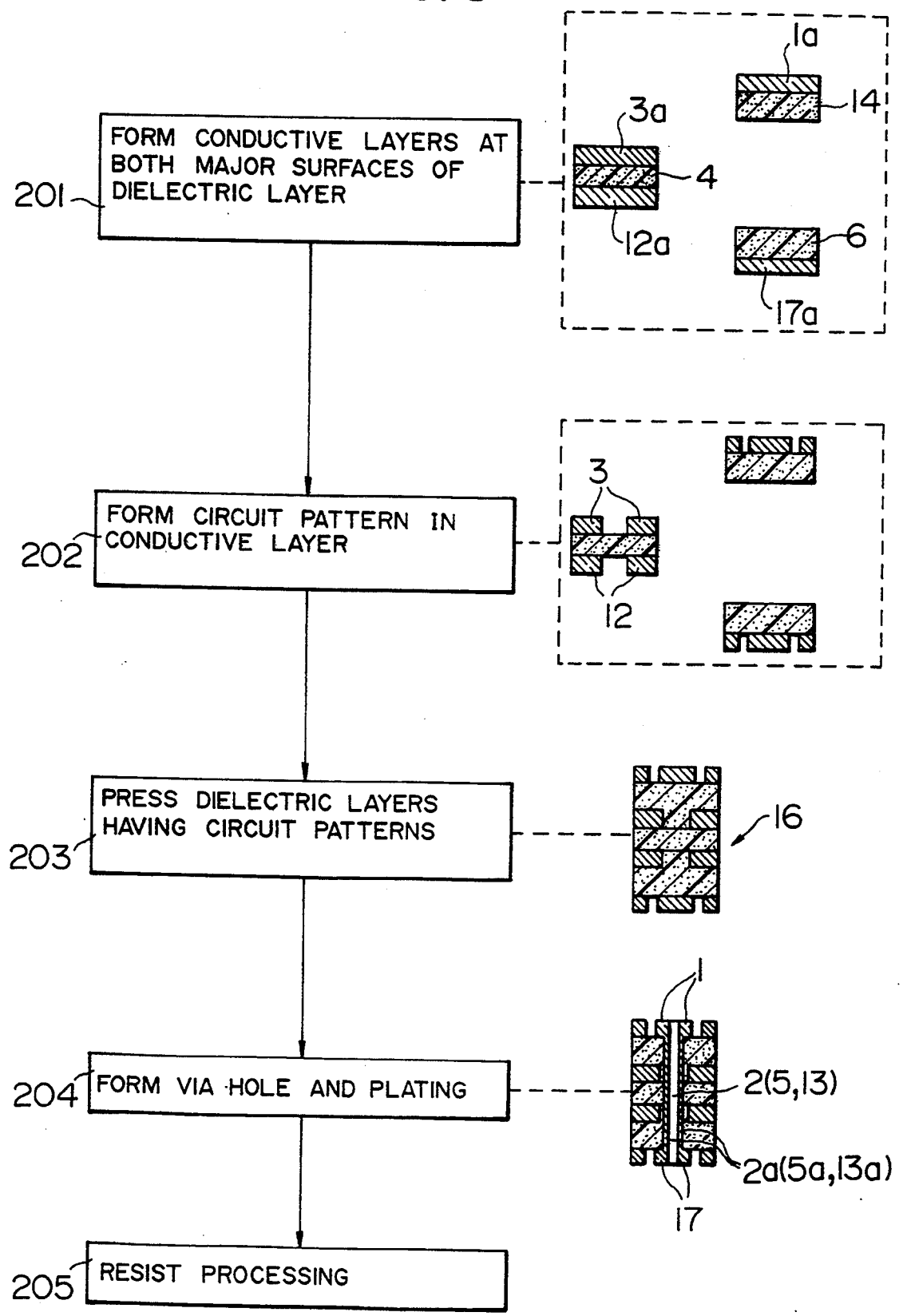

INTEGRATED MULTILAYERED MICROWAVE CIRCUIT

BACKGROUND OF THE INVENTION

1. Field of the Invention

The present invention generally relates to integrated multi-layered microwave circuits used in a mobile radio communication system utilizing a radio wave of a microwave band such as a vehicle information and communication systems (VICS) and, more particularly, is directed to an integrated multi-layered microwave circuit and a method of fabricating it which is easily miniaturized and has less signal loss.

2. Description of the Related Art

In the VICS, a vehicle antenna receives various information such as a location of a vehicle or a road condition such as congestion which is transmitted from a terrestrial station such as a beacon provided on a road, and various devices mounted on the vehicle are controlled based on the received information. Further, it has been proposed to arrange the VICS so that the vehicle antenna transmits information from the various devices mounted on the vehicle to an external station such as the earth station or another vehicle. The thus constituted VICS has been put to practical use as an example of the mobile radio communication systems utilizing a radio wave of a microwave band. In particular, it has been an important problem to be solved to miniaturize and decrease weight in a radio communication terminal for a mobile station which is mounted in a movable body (mobile) or vehicle and processes a signal received by a vehicle antenna.

In a conventional circuit arrangement usable as the radio communication terminal for the mobile station of the mobile radio communication system, an antenna portion and a communication portion for processing a signal received by the antenna portion are provided separately, in general, in order to freely position the antenna portion. That is, in almost cases, the antenna portion and the communication portion are located at different portions. For example, in the prior art disclosed in JP-A-2-152304, an antenna for a mobile radio communication and a communication portion are located at different portions and are connected to each other through a coaxial cable.

Further, there have been proposed various circuits in each of which an antenna for a mobile communication for receiving a radio wave of a microwave band is constituted by a micro strip line and integrated with a communication portion for processing the received signal. One is a circuit in which an antenna portion and an integrated circuit constituting a communication portion are separately fabricated and then integrated as described in JP-A-63-316905. Another is a circuit in which an antenna constituted by a micro strip line and a communication portion constituted by a semiconductor circuit are formed on the same major surface of a substrate as described in JP-A-1-112827.

In the circuit described in JP-A-2-152304, since the coaxial cable is used to connect the antenna for the mobile communication and the communication portion, a radio frequency (RF) signal is attenuated due to a signal loss in the coaxial cable, thereby an efficiency of the communication portion degrades.

Further, the circuit described in JP-A-63-316905 has the disadvantage such that, since material of the communication portion, i.e., semiconductor material is different from material of the antenna portion, i.e., conductive material, it is required, in an integrating process of the materials, to provide a conductive layer at a rear surface of the communication portion and to-utilize an adhesive solder, thereby complicating an assembling process of the circuit.

The circuit described in JP-A-1-112827 is advantageous in that signal loss of an RF signal can be decreased and the circuit can be miniaturized and light-weighted since the antenna and the communication portion are integrally formed. However, this circuit has the disadvantage such that since both the antenna and the communication portion are located on the same surface, a radio wave having the same frequency of that from the antenna is transmitted from the communication portion and interferes with a radio wave transmitted from the antenna, so that this circuit can not be applied to one whose communication portion has a modulating function.

Accordingly, it is an object of the present invention to provide an improved integrated multi-layered microwave circuit in which the aforementioned shortcomings and disadvantages encountered with the prior art can be eliminated.

More specifically, it is an object of the present invention to provide an integrated multi-layered microwave circuit which can integrate an antenna portion and a communication portion by using a conventional fabricating process of a circuit substrate and which is small in size and weight, less in signal loss and high in efficiency.

SUMMARY OF THE INVENTION

According to an aspect of the present invention, an integrated multi-layered microwave circuit for use in a radio communication terminal for a mobile station of a mobile radio communication system includes: an antenna portion formed by a micro strip line of conductive material; a communication portion for controlling a radio wave received and/or transmitted by and/or from the antenna portion; at least two dielectric layers laminated between the antenna portion and the communication portion; and at least one conductive layer disposed between the dielectric layers.

According to the thus constituted integrated multi-layered microwave circuit of the present invention, since the antenna portion formed by the micro strip line of conductive material and the communication portion for controlling a radio wave received and/or transmitted by and/or from the antenna portion are laminated through at least two dielectric layers, the antenna portion and the communication portion are integrated, so that the microwave circuit can be miniaturized and light-weighted. Further, since the at least one conductive layer is laminated between the dielectric layers, the conductive layer serves as an antenna together with the micro strip line. Furthermore, since the antenna portion and the communication portion are disposed at opposite major surfaces of the laminated layers, that is, a substrate, the conductive layer shields a radio wave transmitted from and received by the communication portion, so that the radio wave is prevented from being mixed as a noise into a radio wave transmitted from the antenna portion even when the communication portion has a modulating function.

Preferably, the integrated multi-layered microwave circuit further includes a feeding portion for electrically connecting the antenna portion and the communication portion. The feeding portion preferably includes conductors formed by using the plating technique on an inner surface of the dielectric layers which forms a feeding via hole penetrating the dielectric layers between the antenna portion and the communication portion. The feeding via hole and the conductors form a shortest electrical path connecting the antenna portion and the communication portion, thereby signal loss therebetween can be decreased.

Preferably, the conductive layer serves as a grounding layer, and conductors are formed by using the plating technique on an inner surface of the dielectric layer which forms a grounding via hole penetrating the dielectric layer between the grounding layer and the communication portion, wherein the grounding layer and the communication portion are electrically connected through the conductors.

Preferably, the conductive layer serves as a power source layer, and conductors are formed by using the plating technique on an inner surface of the dielectric layer which forms a via hole for a power source penetrating the dielectric layer between the power source layer and the communication portion, wherein the power source layer and the communication portion are electrically connected through the conductors.

Preferably, the integrated multi-layered microwave circuit further includes another conductive layer, wherein one of the conductive layers serves as a grounding layer and the other serves as a power source layer.

Preferably, the antenna portion includes at least one radiator for transmitting and/or receiving a radio wave, and a phase shifter connected between the radiator and the feeding portion for changing a phase of the radio wave transmitted and/or received by the radiator. A radiation directivity of the antenna portion can be controlled by changing a phase of a radio wave by the phase shifter.

Preferably, the phase shifter is constituted by the micro strip line, and a length of the micro strip line is adjusted depending on a location of a mobile where the radiator is mounted so that a desired radiation directivity of the antenna portion is obtained. Since the phase shifter is constituted by the micro strip line, constructions of the microwave circuit can be simplified.

Preferably, the communication portion includes a circuit pattern constituted by conductive material, a receiving portion for demodulating a received radio wave and converting it into information data, a transmitting portion for modulating the information data into a radio wave to be transmitted, a shared portion connected to the feeding portion for separating the received radio wave from the radio wave to be transmitted, an oscillating portion for supplying an oscillation signal to the receiving portion and the transmitting portion, and an interface portion for exchanging the information data obtained by the receiving portion and the information data to be transmitted from the transmitting portion with an external circuit. Further, the shared portion preferably includes a filter.

Preferably, the integrated multi-layered microwave circuit further includes a microcomputer for controlling devices mounted on a mobile based on received information and/or information to be transmitted. Further, the microcomputer preferably outputs control data to a centralized control portion for controlling the devices mounted on the vehicle, whereby the microwave circuit can be further miniaturized and light-weighted.

Preferably, the integrated multi-layered microwave circuit further includes another conductive layer and another dielectric layer, wherein the conductive layers and the dielectric layers are laminated alternately, and wherein at least an adjacent pair of the conductive layers and the dielectric layer sandwiched therebetween constitute a capacitor which constitutes at least a part of the shared portion or the filter for separating the received radio wave from the radio wave to be transmitted. Thus, the number of parts required for the microwave circuit can be decreased and so the microwave circuit can be further miniaturized and light-weighted.

Preferably, at least a side wall of the microwave circuit is covered by conductive material. Thus, a radio wave generated by the communication portion is prevented from being leaked from the side wall of the microwave circuit and being mixed as a noise into a radio wave transmitted and received by the antenna portion.

According to another aspect of the present invention, a method of fabricating an integrated multi-layered microwave circuit includes the steps of: (a) forming conductive layers on both major surfaces of one dielectric layer; (b) forming circuit patterns in the conductive layers; (c) pressing other dielectric layers, on one major surface of each of which a conductive layer is formed, to both major surfaces of the one dielectric layer having the circuit patterns thereon so that the conductive layers and the dielectric layers are integrally laminated alternately to thereby form a substrate; (d) forming circuit patterns in the conductive layers which are formed on the other dielectric layers at both major surfaces of the substrate; (e) repeatedly performing the steps (c) and (d) for a predetermined times; (f) forming via holes in the substrate; and (g) forming conductors by using the plating technique on an inner surface of the substrate which forms each of the via holes to thereby form the substrate for the integrated multi-layered microwave circuit.

According to still another aspect of the present invention, a method of fabricating an integrated multilayered microwave circuit includes the steps of: forming conductive layers on major surfaces of a plurality of dielectric layers; forming circuit patterns in the conductive layers; pressing the plurality of dielectric layers having the circuit patterns so that the conductive layers and the dielectric layers are integrally laminated alternately to thereby form a substrate; forming via holes in the substrate; and forming conductors by using the plating technique on an inner surface of the substrate which forms each of the via holes to thereby form the substrate for the integrated multi-layered microwave circuit.

According to the method of fabricating the integrated multi-layered microwave circuit of the present invention, it is possible to easily form the micro strip line constituting the radiator or the phase shifter, the circuit pattern of the communication portion, and the conductive layer by utilizing the conventional fabricating process of a circuit substrate.

The preceding and other objects, features, and advantages of the present invention will become apparent from the following detailed description of illustrative embodiments thereof when read in conjunction with the accompanying drawings, in which like reference numerals are used to identify the same or similar parts in the several views.

BRIEF DESCRIPTION OF THE DRAWINGS

FIG. 4 is a schematic diagram illustrating a communication system which communicates among the integrated multi-layered microwave circuit of FIGS. 2A and 2B, a microcomputer, a navigator (centralized control system), and devices mounted on a vehicle;

FIG. 8 is a schematic diagram illustrating a second method of fabricating the substrate used in the integrated multi-layered microwave circuit of the embodiment;

DETAILED DESCRIPTION OF THE PREFERRED EMBODIMENTS

An integrated multi-layered microwave circuit according to the first embodiment of the present invention will now be described with reference to FIGS. 1 to 13, in which case the present invention is applied to a radio communication terminal for a mobile station which is used in the VICS utilizing a microwave of not less than 1.0 GHz, for example.

Figure 1:
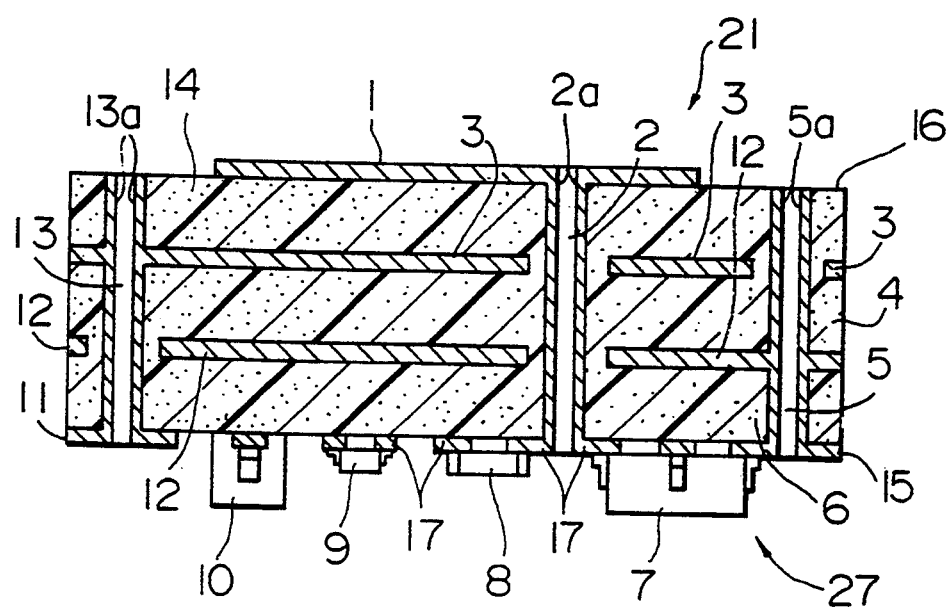
FIG. 1 shows a schematic sectional view of an integrated multi-layered microwave circuit according to a first embodiment of the present invention.

FIG. 1 shows a sectional view of an integrated multi-layered microwave circuit according to the first embodiment. Referring to FIG. 1, an integrated multi-layered microwave circuit 40 (FIG. 4) of the first embodiment includes a substrate 16 constituted of three dielectric layers 4, 6 and 14 and four conductive layers 1, 3, 12 and 17, in which the dielectric layers and the conductive layers are arranged alternately. The conductive layer located on one major surface of the substrate 16 forms a micro strip line 1 to thereby constitute a antenna portion 21. The conductive layer located at the other major surface of the substrate 16 forms a circuit pattern 17 having a grounding line 11 and a power source line 15. The circuit pattern 17 constitutes a communication portion 27 together with discrete parts 7, 8, 9 and 10 incorporated in the circuit pattern 17. One of the two intermediate conductive layers of the substrate 16 forms a grounding layer 3 and the other thereof forms a power source layer 12.

In the substrate 16, a feeding via hole 2 is formed so as to penetrate the dielectric layers between the antenna portion 21 and the communication portion 27. Conductors 2a are formed on an inner surface of the dielectric layers forming the feeding via hole 2 by using the plating technique so that the antenna portion 21 and the communication portion 27 are electrically connected by the conductors 2a. The feeding via hole 2 and the conductors 2a form a feeding portion. The conductors 2a serve to transmit a signal between the antenna portion 21 including the micro strip line 1 and the communication portion 27 including the circuit pattern 17 and the discrete parts 7, 8, 9 and 10. The feeding via hole 2 and the conductors 2a form a shortest path for connecting the antenna portion 21 and the communication portion 27, thereby decreasing signal loss therebetween.

A grounding via hole 13 is also formed in the substrate 16 to penetrate the dielectric layers between the grounding layer 3 and the communication portion 27. Conductors 13a are formed on an inner surface of the dielectric layers forming the ground via hole 13 by using the plating technique to thereby electrically connect the grounding layer 3 and the grounding line 11 by the conductors 13a. Further, a via hole 5 for a power source is formed in the substrate to penetrate the dielectric layers between the power source layer 12 and the communication portion 27. Conductors 5a are formed on an inner surface of the dielectric layers forming the via hole for the power source by using the plating technique to thereby electrically connect the power source layer 12 and the power source line 15.

The configurations of the micro strip line and the circuit pattern shown in FIG. 1 are typical examples and various modifications in configurations thereof may be made. Further, the substrate is illustrated to be thick in FIG. 1 so as to facilitate a better understanding of the embodiment, but a thickness of the substrate is very thin in fact.

The micro strip line 1 is formed by partially etching away the conductive layer located at the one major surface of the substrate 16. Similarly, the circuit pattern 17 is formed by partially etching away the conductive layer located at the other major surface of the substrate 16. The micro strip line I serves as a radiator together with the grounding layer 3. In this regard, an electronic radio wave transmitted from and received by the micro strip line 1 is not influenced by an electronic radio wave radiated from the discrete parts 7 to 10 of the communication portion 27 since the radiated radio wave is shielded by the grounding layer 3.

Figure 2A:
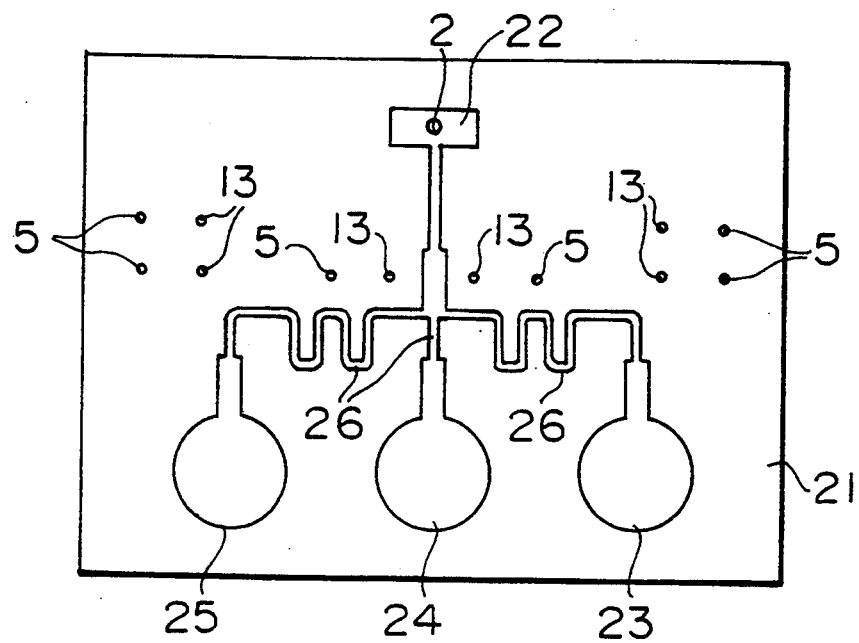
FIG. 2A is a schematic plan view of the integrated multi-layered microwave circuit of FIG. 1 illustrating construction of an antenna portion thereof.
Figure 3A:
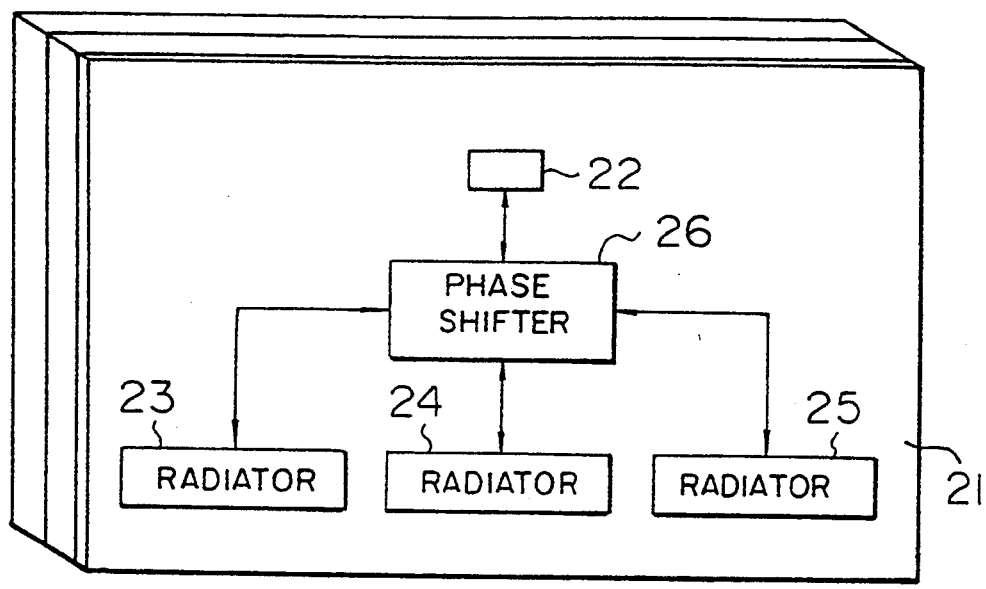
FIG. 3A is a functional block diagram illustrating the antenna portion of the integrated multi-layered microwave circuit of FIG. 1.

Concrete constructions and functions of the antenna portion 21 and the communication portion 27 of the integrated multi-layered microwave circuit 40 will be described. As shown in FIGS. 2A and 3A, the antenna portion 21 includes a feeding land 22 connected to the feeding via hole 2, three circular radiators 23, 24 and 25 formed by the micro strip line 1, and a phase shifter 26 formed by the micro strip line 1 for connecting the respective radiators to the feeding land 22. Phases of signals radiated from the respective radiators 23 to 25 can be changed by changing a length of the micro strip line constituting the phase shifter 26, thereby radiation directivity of the antenna portion 21 can be controlled.

Since the thus constituted antenna portion 21 is formed by the micro strip line and has a flat configuration with no projection, there is no problem in mounting the discrete parts 7, 8, 9 and 10 on the communication portion 27, so that they can be arranged easily thereon. Further, since the discrete parts 7, 8, 9 and 10 are incorporated in the communication portion 27, the microwave circuit can be miniaturized. While the phase shifter of the embodiment is formed by the micro strip line so that a phase of the radiated signal is changed by changing the length of the micro strip line, the phase shifter may be formed by using a diode or the like which can electrically change the phase of the radiated signal.

Figure 2B:
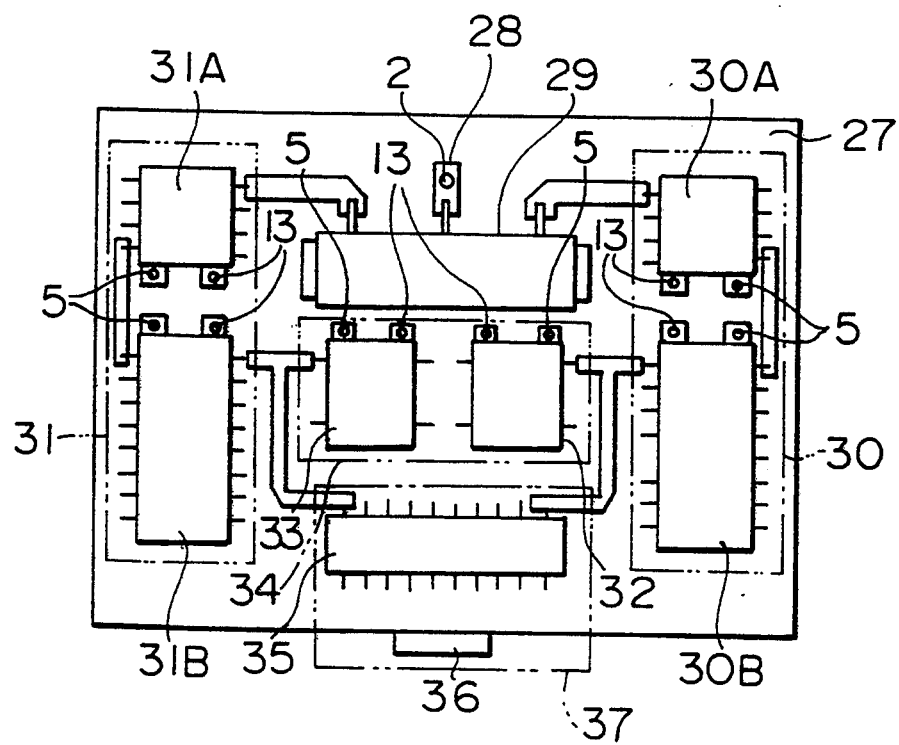
FIG. 2B is a schematic plan view of the integrated multi-layered microwave circuit of FIG. 1 illustrating construction of a communication portion thereof.
Figure 3B:
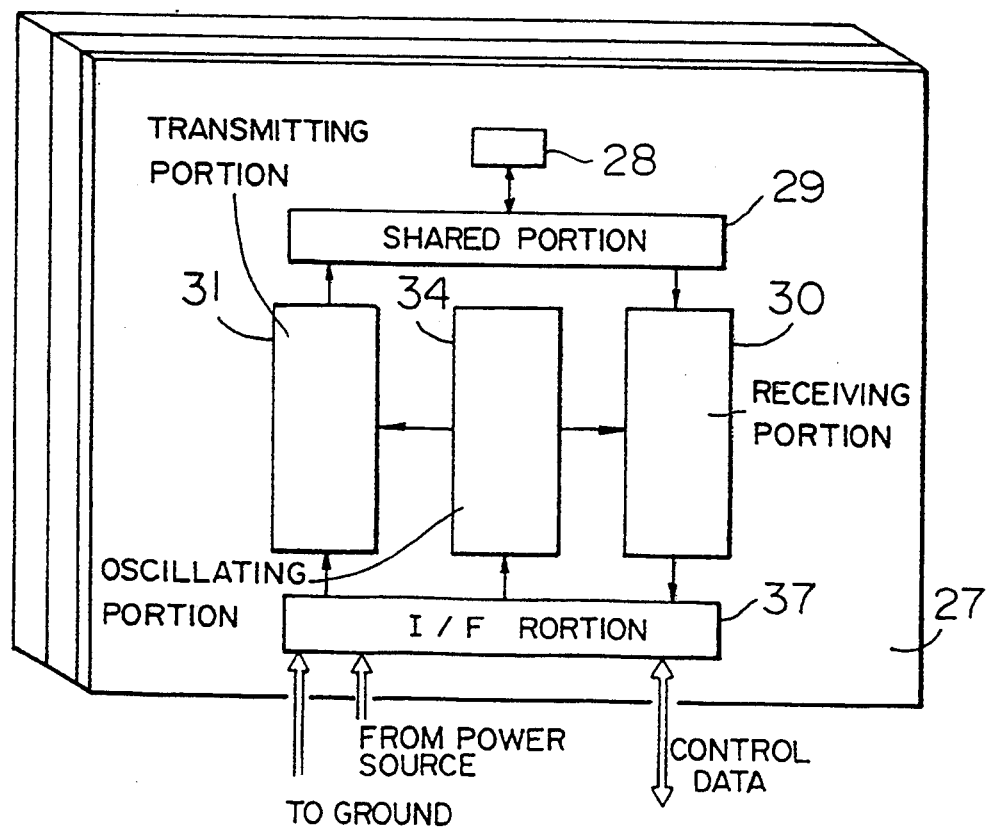
FIG. 3B is a functional block diagram illustrating the communication portion of the integrated multi-layered microwave circuit of FIG. 1.

As shown in FIGS. 2B and 3B, at the communication portion 27, there are mounted, on the circuit pattern 17, a feeding land 28, a common use portion or shared portion 29, a receiving portion 30 having a preamplifier integrated circuit (IC) 30A serving as a receiver and an IC 30B serving as a demodulator, a transmitting portion 31 having a power amplifier IC 31A serving as a transmitter and an IC 31B serving as a modulator, an oscillating portion 34 having an oscillator 32 for the receiver and an oscillator 33 for the transmitter, an interface (I/F) circuit 35 having a phase locked loop (PLL) IC for controlling the oscillating portion 34 and an I/F IC, and a connector 36. The I/F circuit 35 and the connector 36 constitute an I/F portion 37.

The feeding land 28 is connected to the feeding via hole 2 as well as the feeding land 22 of the antenna portion 21 and further connected to the shared portion 29. The shared portion 29 is a kind of filter for separating a received radio wave from a transmitting radio wave, and it can be miniaturized when formed by ceramics of a high relative permittivity, for example.

The receiving portion 30 is a circuit portion which demodulates a received radio wave to obtain communication information of an analog form and converts the analog information into a digital signal to thereby output it. The transmitting portion 31 is a circuit portion which converts a digital signal of inputted communication information to be transmitted into an analog signal and demodulates the analog signal into a radio wave to be transmitted. These functions of analog to digital conversion and vice versa are performed by the IC 30B and the IC 31B, respectively.

The oscillator 34 is a frequency synthesizer for supplying a local oscillation signal to the receiving portion 30 and the transmitting portion 31 under the control of an external microcomputer etc. The I/F circuit 35 is a circuit portion which communicates with the external microcomputer etc. as to data in a digital form such as data demodulated by the receiving portion 30, data to be modulated by the transmitting portion 31, and data for controlling the oscillating portion 34. The connector 36 is a connecting portion which is used to connect the microwave circuit with a digital device such as the external microcomputer.

An example of a communication system in which devices mounted on a vehicle are controlled in accordance with information from the integrated multi-layered microwave circuit 40 will be explained with reference to FIG. 4.

Referring to FIG. 4, the integrated multi-layered microwave circuit 40 according to the first embodiment communicates control data of a digital signal with an external microcomputer 41 mounted on the vehicle through the I/F portion 37 shown in FIGS. 2B and 3B of the communication portion 27. The microcomputer 41 communicates control data of a digital signal with a navigator (centralized control system) 42 mounted on the vehicle, and controls through the navigator 42 devices mounted on the vehicle such as a cathode ray tube (CRT) 43, a compact disc read only memory (CD-ROM) 44, an audio playback unit 45, and an air conditioner 46. The power source layer 12 and the grounding layer 3 (FIG. 1) of the integrated multi-layered microwave circuit 40 of FIG. 1 are connected to power source and a ground of the microcomputer 41, respectively.

The CRT 43 is a device for displaying states of the CD-ROM 44, the audio playback unit 45 and the air conditioner 46 or the like. FIG. 4 is a conceptional view and so in practice the microcomputer 41 and the navigator (centralized control system) 42 are disposed in a console panel of the vehicle mounting the CRT 43 and the audio playback unit 45. The mounting location and the radiation directivity of the integrated multi-layered microwave circuit 40 in the vehicle will be described later.

Figure 5:
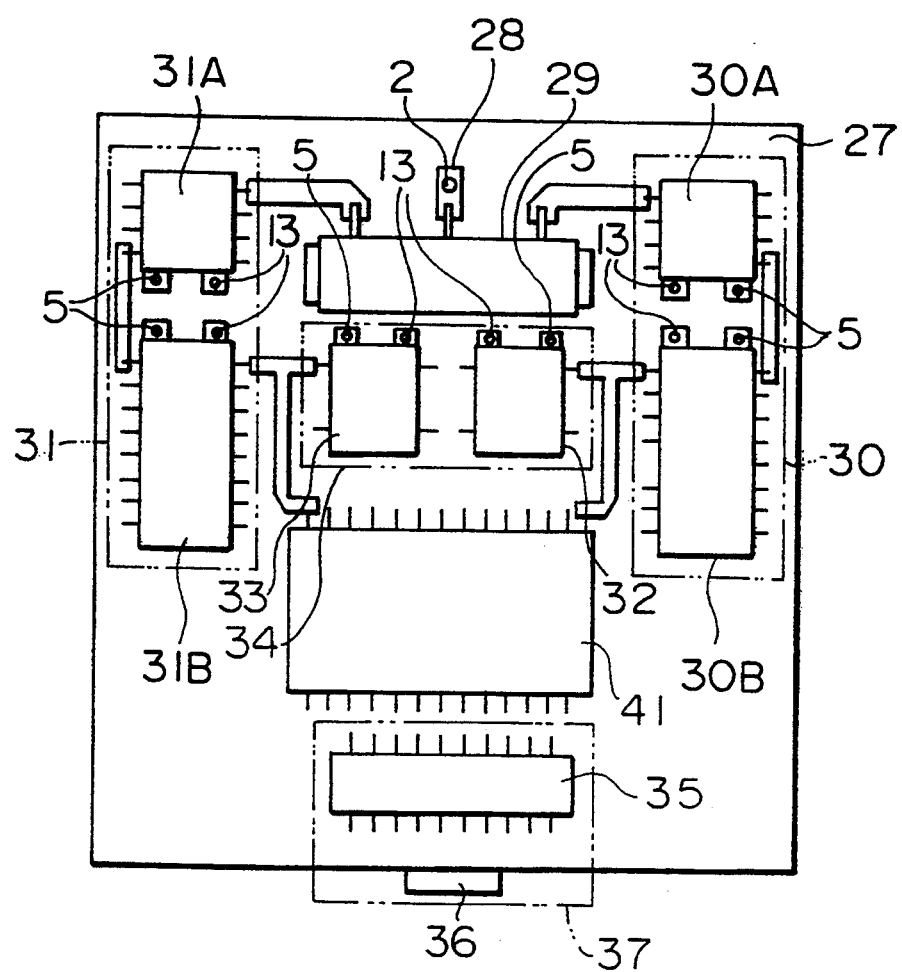
FIG. 5 is a schematic plan view illustrating another example of the communication portion of the integrated multi-layered microwave circuit of FIG. 1 in which a microcomputer is formed on a substrate thereof.

The integrated multi-layered microwave circuit 40 may be located close to the microcomputer 41 or the navigator 42. For example, as shown in FIG. 5, the microcomputer 41 may be integrally formed on the substrate of the integrated multi-layered microwave circuit 40, thereby size and weight of the radio communication terminal for the mobile station can be further decreased. In this case, the microcomputer 41 is disposed between the I/F portion SY and an area having the receiving portion 30, oscillating portion 34 and transmitting portion 31. Then, the microcomputer 41 carries out a digital communication with the external navigator 42 through the I/F portion 37.

Figure 6:
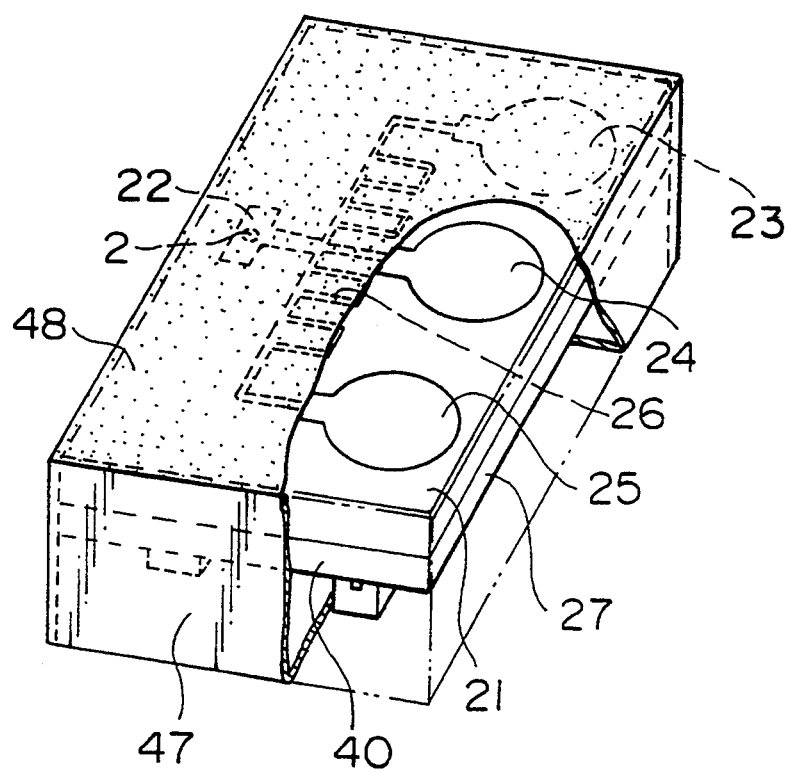
FIG. 6 is a partially cutaway view in perspective illustrating a metal casing in which the integrated multi-layered microwave circuit of FIGS. 2A and 2B is incorporated.

FIG. 6 is a partially cutaway perspective view illustrating a metal casing 47 in which the integrated multi-layered microwave circuit 40 of the embodiment is incorporated. Referring to FIG. 6, a front surface of the substrate of the integrated multi-layered microwave circuit 40 constitutes the antenna portion 21 which transmits and receives a radio wave through the radiators 23, 24 and 25, and a rear surface thereof constitutes the communication portion 27 which performs a signal processing. The metal casing 47 is provided with a plastic lid 48 for protecting the circuit in the casing. In the metal casing 47, a power supply circuit or a substrate mounting a control circuit etc. incorporating the microcomputer 41 may be disposed close to the integrated multi-layered microwave circuit. Alternatively, the substrate integrally mounting the integrated multi-layered microwave circuit 40 and the microcomputer 41 may be disposed in the casing.

When the integrated multi-layered microwave circuit 40 is accommodated in the metal casing 47 in this manner, at least side walls of outer periphery of the substrate 16 are covered by conductive material, so that a radio wave generated at the communication portion 27 is prevented from leaking from the side walls of the substrate and interfering with a radio wave transmitted from and received by the antenna portion 21 as noise. In order to change the radiation directivity of the antenna portion 21, an orientation of the metal casing 47 may be changed, but it is more preferable to control the radiation directivity of the antenna portion by adjusting the phase shifter 26 as described above depending on a location where the metal casing is mounted.

Figure 7:
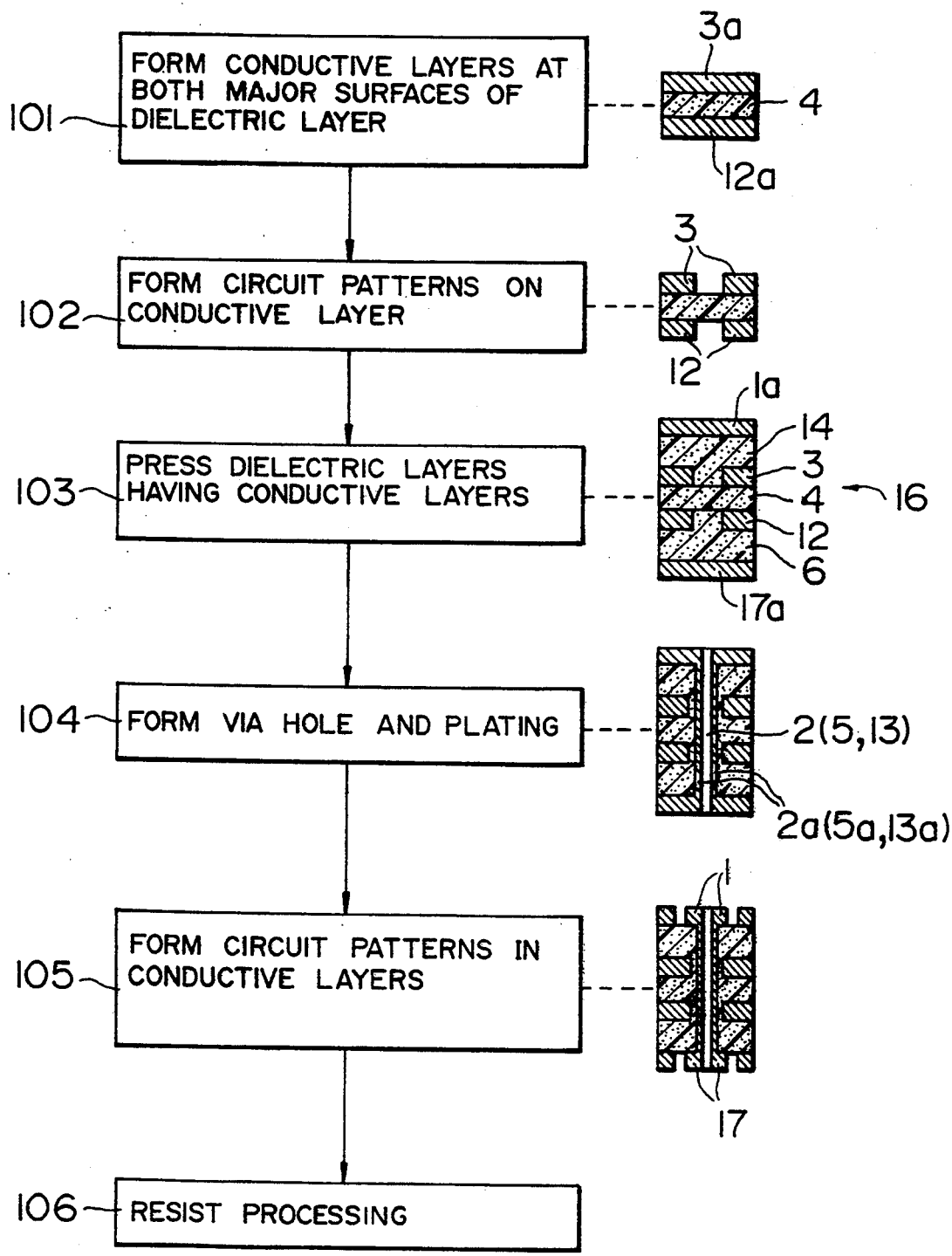
FIG. 7 is a schematic diagram illustrating a first method of fabricating the substrate used in the integrated multi-layered microwave circuit of the embodiment.

Fabricating methods of the integrated multi-layered microwave circuit 40 of the embodiment will be described with reference to FIGS. 7 and 8. Since there are two separate methods in fabricating the substrate 16 of the integrated multi-layered microwave circuit 40, they will be explained separately with reference to FIGS. 7 and 8, respectively.

Firstly, the first fabricating method will be described with reference to FIG. 7. As shown in FIG. 7, at first, conductive layers 3a and 12a are formed at both major surfaces of the dielectric layer 4 at step 101. Then, the conductive layers 3a and 12a are selectively etched away to form circuit patterns on the both major surfaces of the dielectric layer 4, respectively, in step 102. The conductive layers forming these circuit patterns constitute the grounding layer 3 and the power source layer 12, respectively.

In step 103, the dielectric layer 6 and the dielectric layer 14 on which conductive layer 17a and 1a are formed in the same manner as step 101, respectively, are pressed on both major surfaces of the dielectric layer 4 having the above-described circuit pattern, respectively, thereby forming the substrate 16 having the three dielectric layers and the four conductive layers. In this case, the dielectric layers and the conductive layers are pressed so as to be disposed alternately.

Then, in step 104, the feeding via hole 2, the via hole 5 for the power supply and the grounding via hole 13 are formed in the substrate 16, and then the conductors 2a, 5a and 13a are formed on the inner surfaces of the dielectric layers forming these via hole 2, 5 and 13 by using the plating technique, respectively.

Circuit patterns are formed in the conductive layers 1a and 17a on both major surfaces of the substrate by the etching technique, respectively in step 105. These conductive layers in which the circuit patterns are formed constitute the micro strip line 1 of the antenna portion 21 and the circuit pattern 17 of the communication portion 27. Lastly, the resist processing is performed on the circuit pattern 17 to form a protecting film thereof in step 106, then the discrete parts 7 to 10 (see FIG. 1) are arranged in the communication portion 27 to thereby form the integrated multi-layered microwave circuit 40.

The second fabricating method will be described with reference to FIG. 8. As shown in FIG. 8, firstly, in step 201, conductive layers 3a and 12a are formed at both major surfaces of the dielectric layer 4 in the same manner as step 101, and further conductive layers 1a and 17a are formed on one major surfaces of the dielectric layers 14 and 6, respectively.

Then, the conductive layers 3a and 12a on both major surfaces of the dielectric layer 4, the conductive layer 1a on the dielectric layer 14, and the conductive layer 17a of the dielectric layer 6 are selectively etched away to form circuit patterns in step 202. Among these conductive layers in which the circuit patterns are thus formed, the conductive layers on both major surfaces of the dielectric layer 4 constitute the grounding layer 3 and the power source layer 12, that of the dielectric layer 14 constitutes the micro strip line 1 of the antenna portion 21, and that of the dielectric layer 6 constitutes the circuit pattern 17 of the communication portion 27.

Then, in step 203, the dielectric layer 6 and the dielectric layer 14 on each of which the circuit pattern is formed are pressed on both major surfaces of the dielectric layer 4, respectively, thereby forming the substrate 16 having the three dielectric layers and the four conductive layers. In this case, the dielectric layers and the conductive layers are pressed so as to be disposed alternately.

Then, in step 204, the feeding via hole 2, the via hole 5 for the power supply and the grounding via hole 13 are formed in the substrate 16, and then the conductors 2a, 5a and 13a are formed on the inner surfaces of the dielectric layers forming these via hole 2, 5 and 13 by using the plating technique, respectively. Lastly, the resist processing is performed on the circuit pattern 17 to form a protecting film thereof in step 205, then the discrete parts 7 to 10 (see FIG. 1) are arranged in the communication portion 27 to thereby form the integrated multi-layered microwave circuit 40.

In each of the first and second fabricating methods, each of the micro strip line 1 constituting the antenna portion 21, the circuit pattern 17 of the communication portion, the grounding layer 3, and the power source layer 12 can be formed easily by utilizing the conventional fabricating process of a circuit substrate, so that the integrated multi-layered microwave circuit 40 can be fabricated easily.

Figure 9A:
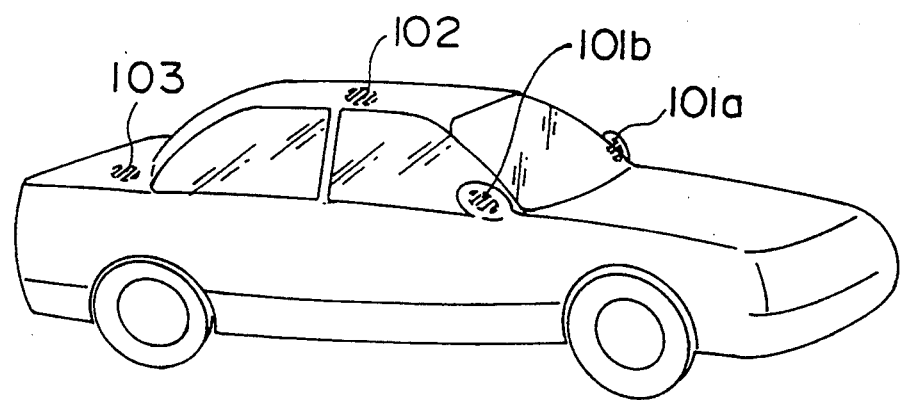
FIG. 9A is a schematic diagram illustrating external locations of an automobile body at which the integrated multi-layered microwave circuit of the embodiment may be mounted.

Then, the explanation will be made with reference to FIGS. 9A to 11B about locations of an automobile at which the integrated multi-layered microwave circuit of the embodiment can be mounted and radiation directivity thereof. As shown in FIG. 9A, the integrated multi-layered microwave circuit of the embodiment may be located at an exterior portion of an automobile body such as a position within one of at least two side mirrors 101a and 101b, a position 102 on a roof top or a buried position within the roof top, or a right or left end portion 103 of a tail gate.

Figure 9B:
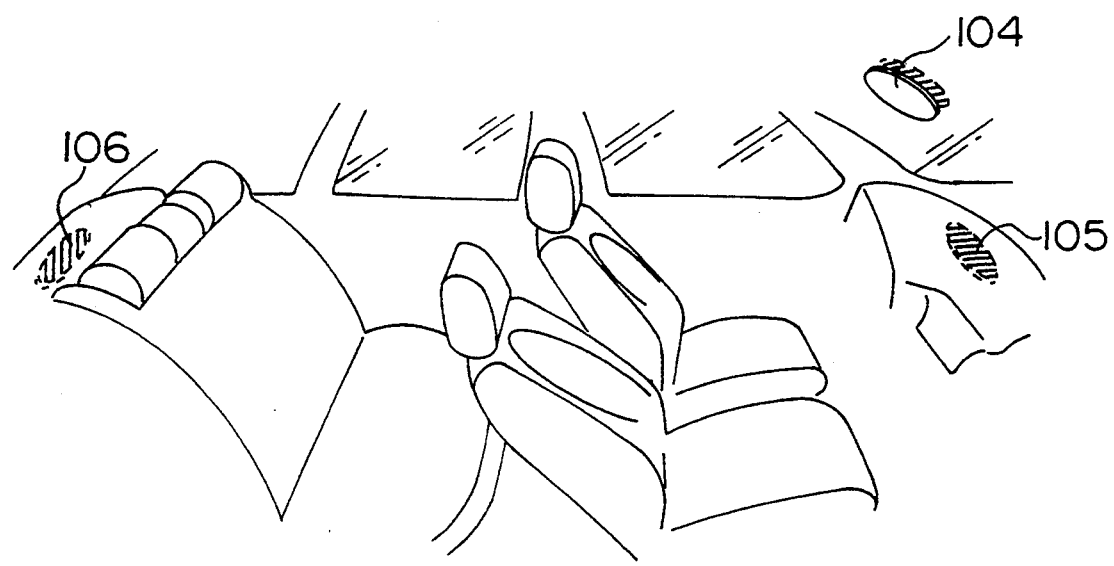
FIG. 9B is a schematic diagram illustrating internal locations of an automobile body at which the integrated multi-layered microwave circuit of the embodiment may be mounted.

Alternatively, as shown in FIG. 9B, the integrated multi-layered microwave circuit of the embodiment may be located at an interior portion of the automobile such as a position within a room mirror 104, a position 105 on a dash board or a buried position within the dash board, or a position 106 on a rear tray or a buried position within the rear tray. A location where the integrated multi-layered microwave circuit of the present invention is mounted may be suitably determined depending on a configuration of an automobile and an efficiency of the microwave circuit.

The antenna portion of the integrated multi-layered microwave circuit located at any portion shown in FIGS. 9A and 9B has the radiation directivity that there is generally no gain at lower direction of the automobile to thereby prevent the influence of a reflection wave from the ground.

Figure 10A:
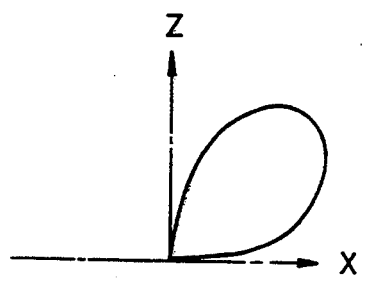
FIGS. 10A to 10H are schematic diagrams illustrating radiation patterns of the integrated multi-layered microwave circuits of the present invention located at the portions shown in FIGS. 9A and 9B, respectively.

The explanation will be made referring to FIGS. 10A to 10H about radiation patterns of the integrated multi-layered microwave circuits of the present invention located at the portions shown in FIGS. 9A and 9B. In this case, coordinate axes of the radiation pattern as to the automobile will be defined as shown in FIGS. 11A and 11B. The radiation pattern of the integrated multi-layered microwave circuit located at the position 101a within the door mirror will be that shown in FIGS. 10A and 10B. Namely, the radiation pattern will be high in gain to a front direction of the automobile (a positive direction of an x-axis) and an upper direction of the automobile (a positive direction of a z-axis) but low to a rear direction (a negative direction of the x-axis) as shown in FIG. 10A, and further slightly high at a left side of the automobile (a positive direction of a y-axis) when compared with a right side thereof due to the presence of a side wall of the automobile to thereby exhibit not symmetric pattern as shown in FIG. 10B.

Figure 10B:
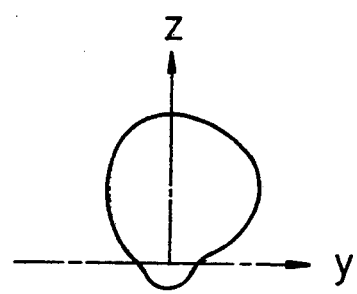
Figure 11A:
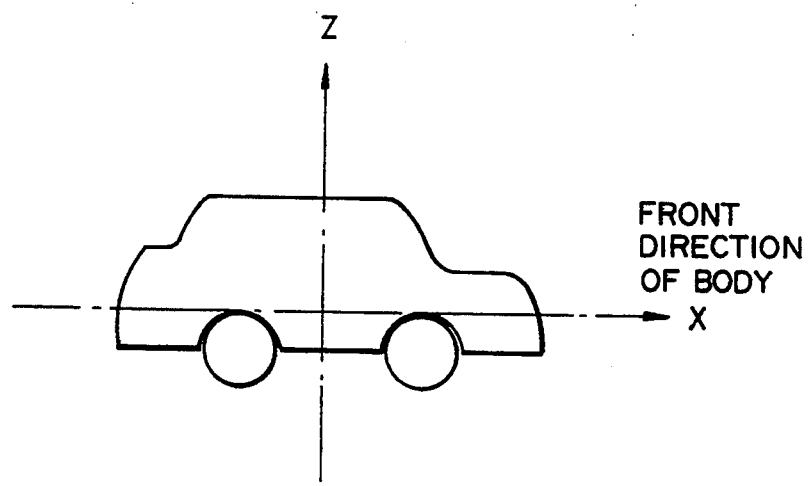
FIGS. 11A and 11B are schematic diagrams illustrating coordinate axes of the radiation pattern of the integrated multi-layered microwave circuit of the present invention as to the automobile.
Figure 11B:
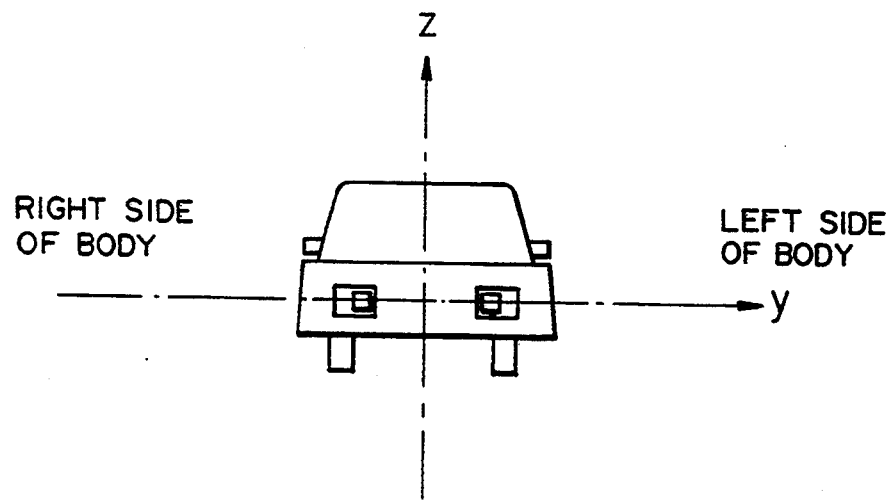

The radiation pattern of the integrated multi-layered microwave circuit located at the position 101b within the door mirror will be same as that at the position 101a except that the radiation pattern corresponding to that of FIG. 10B is inverse to that of FIG. 10B to the y-axis direction.

Figure 10C:
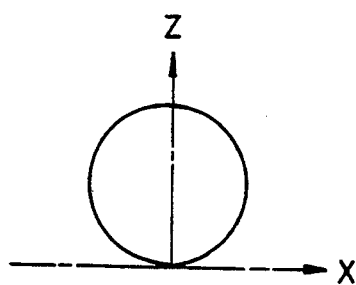
Figure 10D:
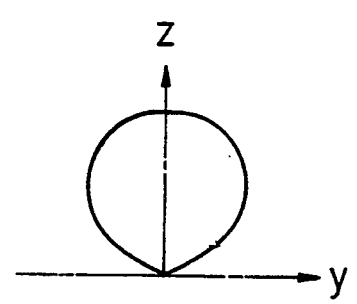

The radiation pattern of the integrated multi-layered microwave circuit located at each of the roof top position 102 and the end portion 103 of the tail gate will be high in gain generally to the upper direction of the automobile (the positive direction of the z-axis) and exhibit a symmetric pattern as shown in FIGS. 10C and 10D.

Figure 10E:
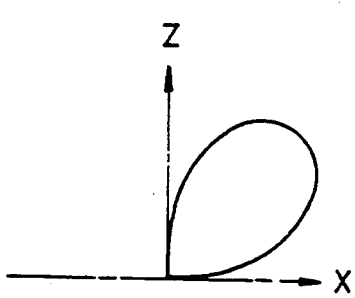
Figure 10F:
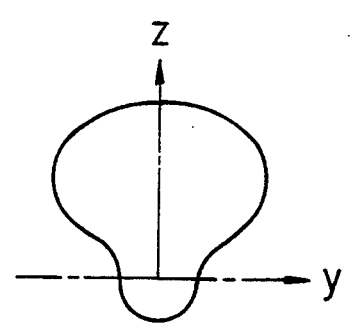

The radiation pattern of the integrated multi-layered microwave circuit located at the position 104 within the room mirror will be same as that at the position 101a or 101b to the longitudinal or x-axis direction of the automobile as shown in FIG. 10E, but exhibit a symmetric pattern to the direction perpendicular to the longitudinal direction or y-axis direction as shown in FIG. 10F due to the presence of the side walls of the automobile.

Figure 10G:
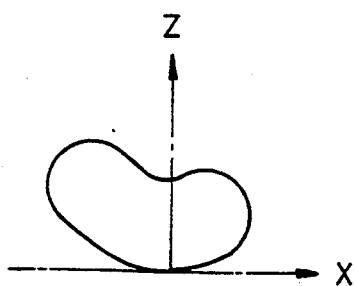
Figure 10H:
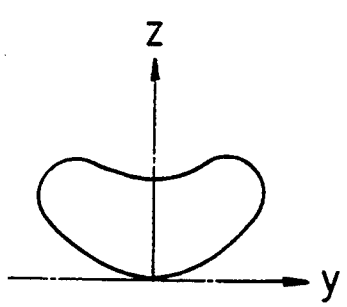

The radiation pattern of the integrated multi-layered microwave circuit located at the position of the dash board 105 will be low in gain to the upper direction of the automobile (the positive direction of the z-axis) and high in gain to the front direction of the automobile (the positive direction of the x-axis) as shown in FIG. 10G since the circuit is located at the interior of the automobile, and further exhibit a symmetric pattern to the direction perpendicular to the longitudinal direction of the automobile or y-axis direction as shown in FIG. 10H.

The radiation pattern of the integrated multi-layered microwave circuit located at the position of the rear tray 106 is same as that located at the dash board 105 except that the radiation pattern corresponding to that of FIG. 10G is inverse to that of FIG. 10G to the longitudinal direction of the automobile in a manner that the gain is high to the rear direction of the automobile (the negative direction of the x-axis direction).

The radiation directivity of the integrated multi-layered microwave circuit located at these positions can be controlled by adjusting the phase shifters of the antenna portion. That is, a phase of a radio wave radiated from the radiators can be changed when the lengths of the phase shifters constituted by the micro strip line is changed. Further, the radiation directivity of the antenna portion can be changed depending on the location where the integrated multi-layered microwave circuit is mounted, thereby a suitable radio communication area can be assured.

Figure 12:
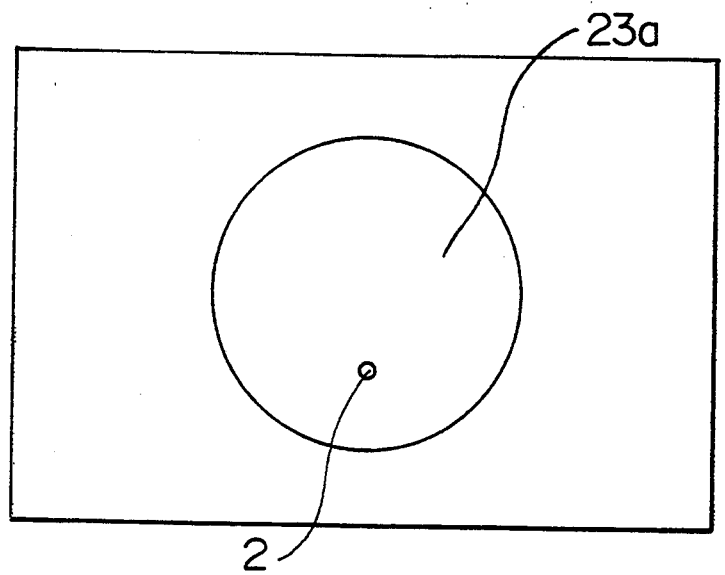
FIG. 12 is a schematic plan view of the integrated multi-layered microwave circuit of FIG. 1 illustrating a modification of an antenna portion thereof.
Figure 13:
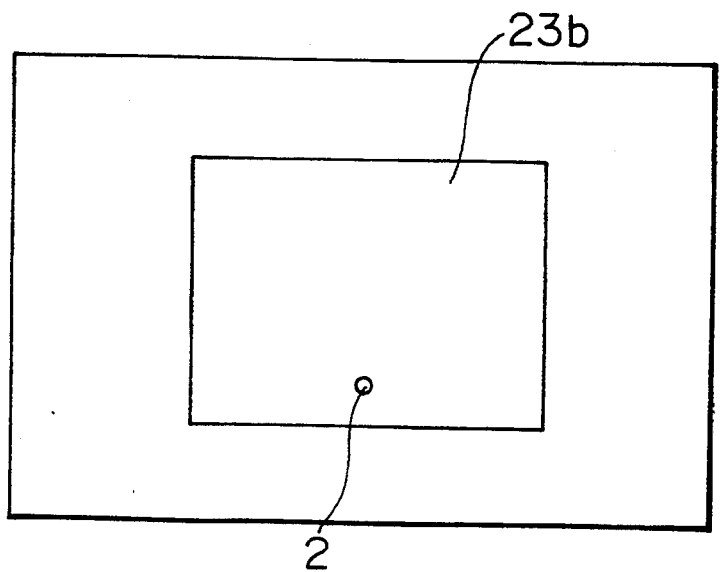
FIG. 13 is a schematic plan view of the integrated multi-layered microwave circuit of FIG. 1 illustrating another modification of an antenna portion thereof.

FIGS. 12 and 13 show modifications of the antenna portion of the embodiment. In the antenna portion of FIG. 12, the radiator constitutes a circular patch antenna 23a, while in the antenna portion of FIG. 13, the radiator constitutes a rectangular patch antenna 23b. In each of the modifications, the radiator (antenna portion) is directly connected to the feeding via hole 2 without providing the phase shifters. These modifications are employed when the integrated multi-layered microwave circuit is not required to have significant radiation directivity, and the circuit of these modifications can be manufactured easily since the phase shifters of complicated configurations are not required.

As described above, in accordance with the embodiment, since the antenna portion 21 and the communication portion 27 are integrally mounted on the both major surfaces of the substrate, the integrated multi-layered microwave circuit can be miniaturized and light-weighted. Further, since the antenna portion 21 and the communication portion 27 are connected with each other through the feeding via hole 2 and the conductors 2a, the antenna portion 21 and the communication portion 27 are connected through a shortest electrical path and so the integrated multi-layered microwave circuit of the embodiment can decrease signal loss. Furthermore, a radio wave generated from the communication portion 27 is shielded by the conductive layer, that is, the grounding layer 3 or the power source layer 12, so that an electronic radio wave radiated from the communication portion 27 is prevented from being mixed into a radio wave transmitted from and received by the antenna portion 21, thereby the integrated multi-layered microwave circuit of the embodiment can provide a higher efficiency.

Furthermore, since the microcomputer 41 and the integrated multi-layered microwave circuit 40 are integrated, the radio communication terminal for the mobile station can be further miniaturized and light-weighted. Further, since the integrated multi-layered microwave circuit is accommodated in the metal casing 47, so that a radio wave generated at the communication portion 27 is prevented from leaking from the side walls of the substrate and interfering with a radio wave transmitted from and received by the antenna portion 21 as noise.

Further, the integrated multi-layered microwave circuit 40 can be manufactured easily by employing the fabricating process of a printed circuit similar to the conventional process.

Furthermore, since a phase of a radio wave radiated from the integrated multi-layered microwave circuit can be changed by adjusting the phase shifters, the radiation directivity of the antenna portion can be controlled depending on a location where the microwave circuit is mounted.

An integrated multi-layered microwave circuit according to the second embodiment will be described with reference to FIGS. 14 to 19B.

Figure 14:
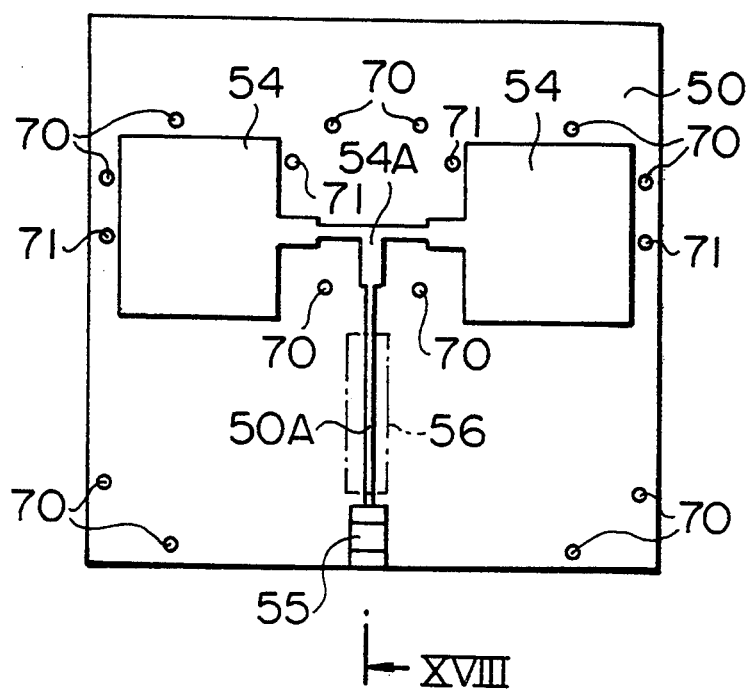
FIG. 14 is a schematic plan view of an integrated multi-layered microwave circuit according to a second embodiment illustrating construction of an antenna portion thereof.
Figure 15:
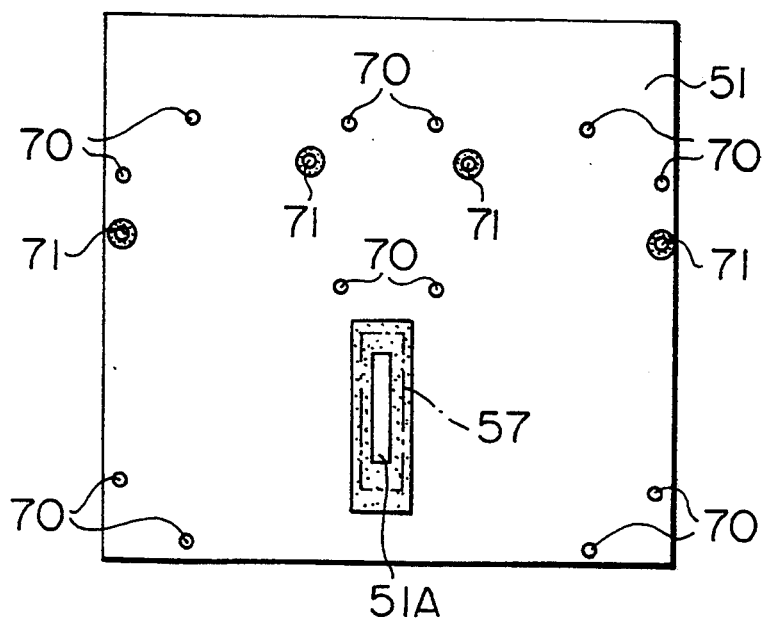
FIG. 15 is a schematic plan view of the integrated multi-layered microwave circuit according to the second embodiment illustrating construction of a grounding layer (conductive layer) thereof.
Figure 16:
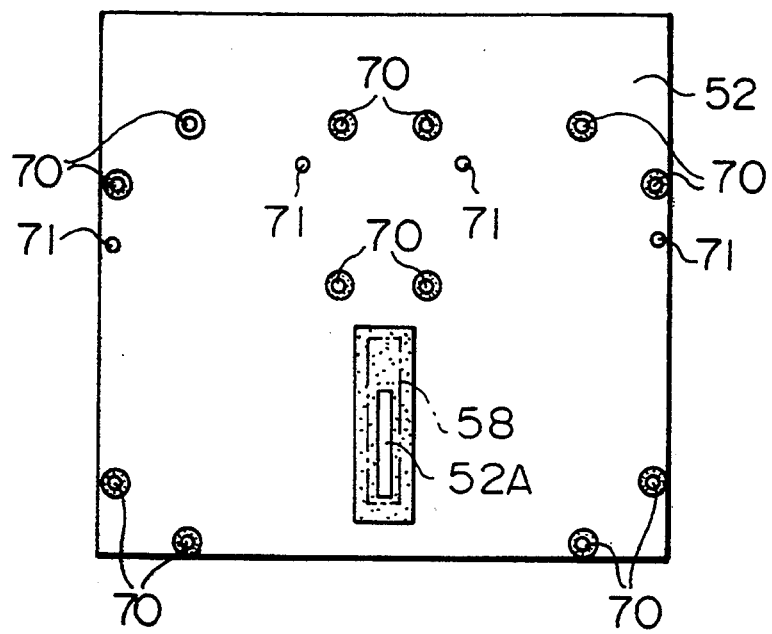
FIG. 16 is a schematic plan view of the integrated multi-layered microwave circuit according to the second embodiment illustrating construction of a power source layer (conductive layer) thereof.
Figure 17:
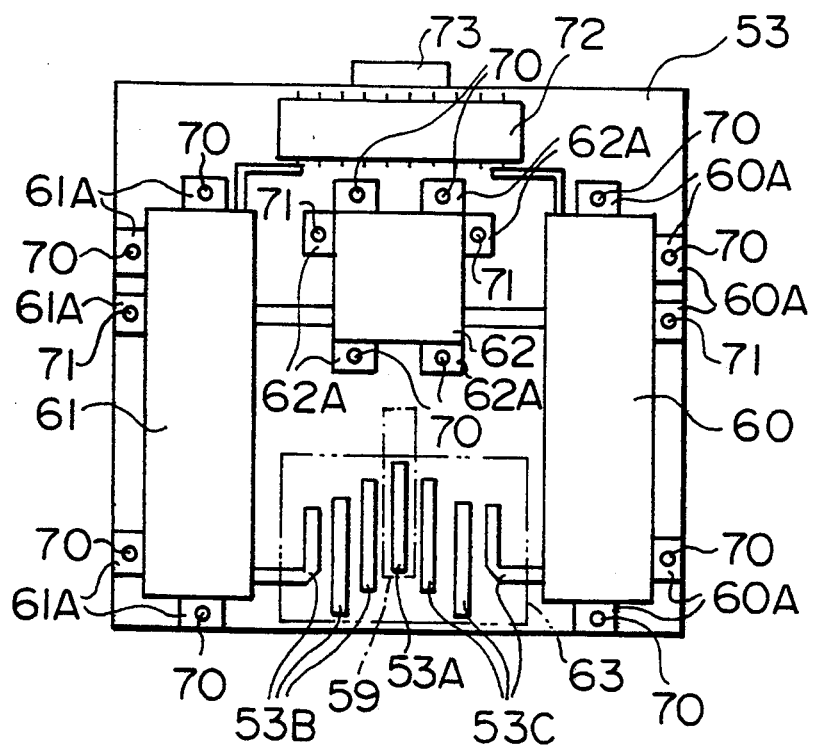
FIG. 17 is a schematic plan view of the integrated multi-layered microwave circuit according to the second embodiment illustrating construction of a communication layer thereof.

The integrated multi-layered microwave circuit of the second embodiment is constituted in a manner that an antenna portion 50 shown in FIG. 14, a ground layer (conductive layer) 51 shown in FIG. 15, a power source layer (conductive layer) 52 shown in FIG. 16, and a communication portion 53 shown in FIG. 17 are laminated and then dielectric layers are disposed therebetween. A process of fabricating the integrated multi-layered microwave circuit of this embodiment is substantially the same as that shown in FIG. 7 or 8.

Each of these layers is provided with grounding via holes 70 and via holes 71 for a power source. The grounding via holes 70 are connected to the grounding layer 51 but electrically insulated from the power source layer 52. The via holes 71 for the power source are connected to the power source layer 52 but electrically insulated from the grounding layer 51.

In the antenna portion 50, an antenna 54, a phase shifter 54A, a conductive portion 50A and also a terminating resistor element 55 are formed by a micro strip line. The terminating resistor element 55 is a chip resistor constituted by a printed circuit element of a thin film or a pressure membrane, and provided so as to decrease a voltage standing wave ratio (VSWR) viewed from the communication portion 53 to match with an input impedance of the communication portion 53, and also so as to decrease a VSWR viewed from the antenna portion 50 to match with an output impedance of the antenna portion 50. The terminating resistor element 55 may be omitted when the constitution of the antenna portion 50 is modified to perform impedance matching.

In the communication portion 53, receiving, transmitting, and oscillating portions are mounted on a circuit pattern as a receiving portion module 60, a transmitting portion module 61 and an oscillating portion module 62, respectively. The grounding via hole 70 and the via hole 71 for the power source are formed in each of lands (conductive layers) 60A, 61A and 62A provided at the respective modules so as to penetrate therethrough. Conductors are formed on an inner surface of the dielectric layers forming each of the grounding via holes 70 and the via holes 71 for power supply by using the plating technique, and the conductors are connected to corresponding lands.

The communication portion 53 is further provided with an I/F circuit 72 and a connector 73 having the same functions of those shown in FIG. 2. Further, in the communication portion, conductive portions of strip configurations 53A, 53B and 53C are aligned stepwise to form a series of flat conductors. The series of flat conductors constitute capacitive and inductive elements to serve as a band pass filter or a high pass filter.

Namely, the series of flat conductors constituted by the conductor portions 53A to 53C constitute a part of a shared portion 63 for separating a received radio wave from a radio wave to be transmitted.

Figure 18:
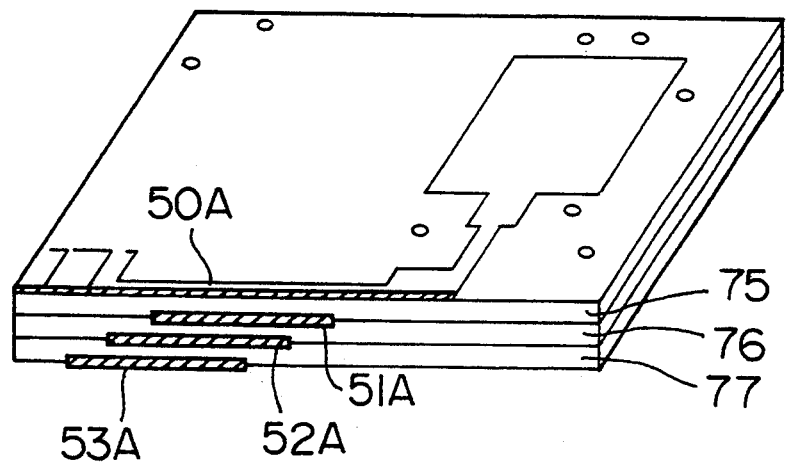
FIG. 18 is a schematic perspective sectional view of the integrated multi-layered microwave circuit of the second embodiment taken along a line XVIII—XVIII in FIG. 14.

The antenna portion 50 and the communication portion 53 are connected not through such a feeding portion as shown in FIG. 1, but electromagnetically coupled to each other through a distributed constant circuit which is extended to a laminated direction of the substrate and formed by a coupling portion 56 of the antenna portion 50, a coupling portion 57 of the grounding layer 51, a coupling portion 58 of the power source layer 52, and a coupling portion 59 of the communication portion 53. The distributed constant circuit serves as a feeding portion. That is, as shown in FIG. 18, a conductive portion 50A of the antenna portion 50, a conductive portion 51A of the grounding layer 51, a conductive portion 52A of the power source layer 52, and a conductive portion 53A of the communication portion 53 are aligned stepwise to a laminated direction thereof through dielectric layers 75, 76 and 77 to form a series of three-dimensional conductors. The series of three-dimensional conductors constitute capacitive and inductive elements to serve as a band pass filter or a high pass filter. Namely, like the flat capacitive and inductive elements constituted by the conductor portions 53A to 53C, the series of three-dimensional conductors constituted by the conductor portions 50A to 53A constitute a part of the shared portion 63 for separating a received radio wave from a radio wave to be transmitted.

Figure 19A:
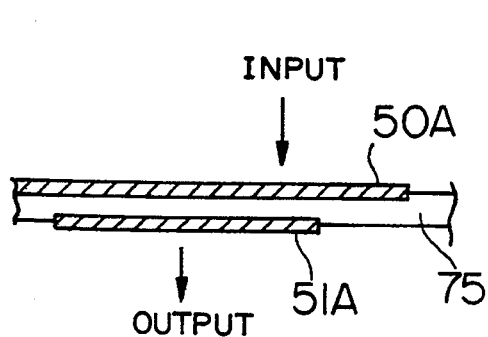
FIG. 19A is a schematic sectional view illustrating a portion of FIG. 18 constituted by conductive portions 50A, 51A and a dielectric layer disposed therebetween.
Figure 19B:
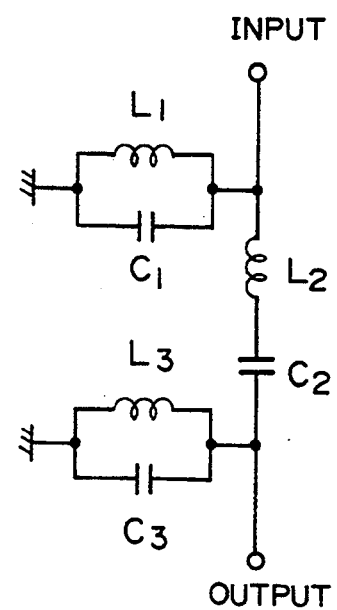
FIG. 19B is a schematic diagram illustrating an equivalent circuit of the portion shown in FIG. 19A.

An example of an equivalent circuit of the series of three-dimensional conductors constituted by the conductor portions 50A to 53A will be described with reference to FIGS. 19A and 19B. Referring to FIG. 19A, in a portion constituted by the conductor portions 50A and 51A and the dielectric layer 75 disposed therebetween, if the conductor portion 50A side and the conductor portion 51A side serve as input and output terminals, respectively, the equivalent circuit of this portion will be that shown in FIG. 19B. That is, in this equivalent circuit, the input terminal is grounded through an inductive element L1 and a capacitive element C1 connected in parallel. Further, the input terminal is connected to the output terminal through an inductive element L2 and a capacitive element C2 connected in series. The output terminal is grounded through an inductive element L3 and a capacitive element C3 connected in parallel. The equivalent circuit constitutes a K type block. Thus, an equivalent circuit of the series of three-dimensional conductors shown in FIG. 18 will be that constituted by connecting three circuits each similar to the $\pi$ type block shown in FIG. 19B.

As described above, in accordance with the second embodiment, since the series of flat conductors constituted by the conductor portions 53A to 53C and the series of three-dimensional conductors constituted by the conductor portions 50A to 53A are utilized as the filters and serve as the shared portion, the integrated multi-layered microwave circuit does not require discrete parts such as a dielectric filter. Thus, this embodiment is advantageous in that the number of required parts can be decreased, and the constructions can be simplified to further miniaturize and decrease in weight, and further cost reduction can be performed. Further, a property of the filter can be arranged to exhibit a steep band pass characteristic by suitably setting sizes of the conductive portions or dielectric constants of the dielectric layers.

While in each of the above-described embodiments, the number of the conductive layers including the antenna portion and the communication portion is four, the number of the dielectric layers and the conductive layers may be increased to constitute a three-dimensional microwave circuit, thereby the number of the discrete parts can be decreased to further miniaturize the microwave circuit.

The micro strip line of the antenna portion may constitute a microwave circuit such as an impedance matching circuit, a filter, or a power divider or directional coupler as well as the radiators and the phase shifters.

As set out above, according to the present invention, since the antenna portion and the communication portion are integrally provided on both major surfaces of the substrate, the integrated multi-layered microwave circuit can be miniaturized and decreased in weight. Further, since the antenna portion is connected to the communication portion through the feeding portion, the antenna portion is connected to the communication portion through a shortest path, so that signal loss can be decreased. Further, since a radio wave generated from the communication portion is shielded by the conductive layer, an electronic radio wave radiated from the communication portion is prevented from being mixed into a radio wave transmitted from and received by the antenna portion, thereby the integrated multi-layered microwave circuit of the present invention can provide a higher efficiency.

Furthermore, since the integrated multi-layered microwave circuit and external circuits such as the microcomputer are closely or integrally disposed, the radio communication terminal for the mobile station can be miniaturized and light-weighted. Further, since at least the external side walls of the integrated multi-layered microwave circuit are covered by the conductor, a radio wave generated at the communication portion is prevented from leaking from the side walls of the microwave circuit.

Furthermore, radiation directivity of the antenna portion can be controlled depending on a location of the mobile where the integrated multi-layered microwave circuit is mounted.

Furthermore, since the three-dimensional distributed constant circuit constitutes at least a part of the shared portion or the filter, the number of parts required for the integrated multi-layered microwave circuit can be decreased, thereby the microwave circuit can be further miniaturized and light-weighted. Further, the filter can be arranged to exhibit a steep band pass characteristic by suitably setting a property thereof.

Furthermore, the integrated multi-layered microwave circuit can be fabricated easily by employing the fabricating process of a printed circuit similar to the conventional process.

Having described the preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

What is claimed is:

1. An integrated multi-layered microwave circuit for use in a radio communication terminal for a mobile station of a mobile radio communication system, comprising:
   antenna circuit formed by a micro strip line of conductive material;
   communication circuit for controlling a radio wave which can be received and transmitted by and from said antenna circuit;
   at least two dielectric layers laminated between said antenna circuit and said communication circuit;
   at least one conductive layer disposed between said dielectric layers;
   further comprising a feeding portion disposed between said antenna circuit and said communication circuit, signals being transmitted between said antenna circuit and said communication circuit; and
   wherein said communication circuit includes a circuit pattern constituted by conductive material, a receiving portion for demodulating a received radio wave and converting it into information data, a transmitting portion for modulating the information data into a radio wave to be transmitted, a shared portion connected to said feeding portion for separating the received radio wave from the radio wave to be transmitted, an oscillating portion for supplying an oscillation signal to said receiving portion and said transmitting portion, and an interface portion for exchanging the information data obtained by said receiving portion and the information data to be transmitted from said transmitting portion with an external circuit.

2. An integrated multi-layered microwave circuit according to claim 1, wherein said feeding portion includes conductors formed by using a plating technique on an inner surface of said dielectric layers which forms a feeding via hole penetrating said dielectric layers between said antenna circuit and said communication circuit.

3. An integrated multi-layered microwave circuit according to claim 1, wherein said conductive layer serves as a grounding layer.

4. An integrated multi-layered microwave circuit according to claim 3, further comprising conductors formed by using the plating technique on an inner surface of said dielectric layer which forms a grounding via hole penetrating said dielectric layer between said grounding layer and said communication circuit, wherein said grounding layer and said communication circuit are electrically connected through said conductor.

5. An integrated multi-layered microwave circuit according to claim 1, wherein said conductive layer serves as a power source layer.

6. An integrated multi-layered microwave circuit according to claim 5, further comprising conductors formed by using the plating technique on an inner surface of said dielectric layer which forms a via hole for a power source penetrating said dielectric layer between said power source layer and said communication circuit, wherein said power source layer and said communication circuit are electrically connected through said conductor.

7. An integrated multi-layered microwave circuit according to claim 1, further comprising another conductive layer, wherein one of said conductive layers serves as a grounding layer and the other serves as a power source layer.

8. An integrated multi-layered microwave circuit according to claim 1, wherein said antenna circuit includes at least one radiator for at least one of transmitting and receiving a radio wave, and a phase shifter connected between said radiator and said feeding portion for changing a phase of the radio wave which can be transmitted and received by said radiator.

9. An integrated multi-layered microwave circuit according to claim 8, wherein said phase shifter is constituted by a micro strip line, and a length of said micro strip line is adjusted depending on a location of a mobile where said radiator is mounted so that a desired radiation directivity of said antenna circuit is obtained.

10. An integrated multi-layered microwave circuit according to claim 1, wherein said shared portion includes a filter.

11. An integrated multi-layered microwave circuit according to claim 1, further comprising a microcomputer controlling devices mounted on at least one of a mobile based on received information and information to be transmitted.

12. An integrated multi-layered microwave circuit according to claim 11, wherein said microcomputer outputs control data to a centralized control means for controlling the devices mounted on the mobile.

13. An integrated multi-layered microwave circuit according to claim 1, further comprising another conductive layer and another dielectric layer, wherein said conductive layers and said dielectric layers are laminated alternately, and wherein at least an adjacent pair of said conductive layers and said dielectric layer sandwiched therebetween constitute a capacitor which constitutes at least a part of a shared portion or a filter for separating the received radio wave from the radio wave to be transmitted.

14. An integrated multi-layered microwave circuit according to claim 1, wherein at least a side wall of said microwave circuit is covered by conductive material.

15. An integrated multi-layered microwave circuit, comprising:
communication means for controlling reception and/or transmission of a radio wave at and/or from an antenna layer which is provided at one major surface of at least one dielectric layer, said communication portion being provided at the other major surface of said dielectric layer;
a feeding portion for electrically connecting said antenna layer and said communication means; and
wherein said communication circuit includes a circuit pattern constituted by conductive material, a receiving portion for demodulating a received radio wave and converting it into information data, a transmitting portion for modulating the information data into a radio wave to be transmitted, a shared portion connected to said feeding portion for separating the received radio wave from the radio wave to be transmitted, an oscillating portion for supplying an oscillation signal to said receiving portion and said transmitting portion, and an interface portion for exchanging the information data obtained by said receiving portion and the information data to be transmitted from said transmitting portion with an external circuit.

16. An integrated multi-layered microwave circuit for use in a radio communication terminal for a mobile station of a mobile radio communication system, comprising:
antenna means formed by a micro strip line of conductive material;
communication means for controlling a radio wave which can be received and transmitted by and from said antenna means;
at least two dielectric layers laminated between said antenna means and said communication means;
at least one conductive layer disposed between said dielectric layers;
further comprising a feeding portion disposed between said antenna means and said communication means, signals being transmitted between said antenna means and communication means; and
wherein said communication means includes a circuit pattern constituted by conductive material, a receiving portion for demodulating a received radio wave and converting into information data, a transmitting portion for modulating the information data into a radio wave to be transmitted, a shared portion connected to said feeding portion for separating the received radio wave from the radio wave to be transmitted, an oscillating portion for supplying an oscillation signal to said receiving portion and said transmitting portion, and an interface portion for exchanging the information data obtained by said receiving portion and the information data to be transmitted from said transmitting portion with an external circuit.

17. An integrated multi-layered microwave circuit for use in a radio communication terminal for a mobile station of a mobile radio communication system, comprising:
a dielectric layer;
antenna formed by a microstrip of conductive material on one surface of said dielectric layer;
a transmitting receiving circuit formed on the other surface of said dielectric layer;
a grounding layer and a power source layer formed in said dielectric layer arranged between said antenna and said transmitting receiving circuit;
a feeding via hole connecting said antenna and said transmitting receiving circuit;
a grounding via hole connecting said transmitting receiving circuit and said grounding layer;
a via hole for a power source connecting said transmitting receiving circuit and said power source layer.

* * * * *